United States Patent [19]

Kawasumi

[11] Patent Number: 5,552,234
[45] Date of Patent: Sep. 3, 1996

[54] COPPER FOIL FOR PRINTED CIRCUITS

[75] Inventor: Yoshio Kawasumi, Toda, Japan

[73] Assignee: Japan Energy Corporation, Tokyo, Japan

[21] Appl. No.: 217,263

[22] Filed: Mar. 24, 1994

[30] Foreign Application Priority Data

Mar. 29, 1993 [JP] Japan .................................. 5-091842
Aug. 31, 1993 [JP] Japan .................................. 5-237181

[51] Int. Cl.$^6$ ............................ C03C 27/00; B32B 15/20
[52] U.S. Cl. ........................ 428/633; 428/632; 428/675; 428/674
[58] Field of Search .................................. 428/632, 633, 428/607, 606, 637, 674, 675

[56] References Cited

U.S. PATENT DOCUMENTS

| | | | |
|---|---|---|---|
| 4,386,139 | 5/1983 | Nakatsugawa | 428/607 |
| 4,572,768 | 2/1986 | Wolski et al. | 428/626 |
| 5,057,193 | 10/1991 | Lin et al. | 204/27 |
| 5,061,550 | 10/1991 | Shimizu et al. | 428/209 |
| 5,262,247 | 11/1993 | Kajiwara et al. | 428/607 |
| 5,338,619 | 8/1994 | Fukuda et al. | 428/674 |
| 5,389,446 | 2/1995 | Yamanishi et al. | 428/637 |

FOREIGN PATENT DOCUMENTS

| | | |
|---|---|---|
| 0181430 | 5/1986 | European Pat. Off. . |
| 0541997 | 5/1993 | European Pat. Off. . |
| 58-7077 | 2/1983 | Japan . |
| 61-33908 | 8/1986 | Japan . |
| 1531454 | 11/1978 | United Kingdom . |
| 2257714 | 1/1993 | United Kingdom . |

OTHER PUBLICATIONS

Patent Abstracts of Japan, vol. 5, No. 156 (C–074) 6 Oct. 1981 & JP–A–56–087–677 (Nippon Mining Co) 16 Jul. 1981.

*Primary Examiner*—Steven Bos
*Attorney, Agent, or Firm*—Seidel, Gonda, Lavorgna & Monaco, P.C.

[57] ABSTRACT

A copper foil for printed circuits including a thermal oxidation-resistant treated layer (e.g., Zn—Ni or Zn—Co alloy plating) formed on the shiny side of the foil and a Cr-base anticorrosive treated layer (e.g., chromate film, mixed film of chromium oxide and zinc and/or zinc oxide, or both) formed further thereon, characterized in that a copper plating layer or an etched surface is provided before forming the thermal oxidation resistant treated layer. The copper plating or etching permits the shiny side to be completely covered with fresh copper or purified to overcome any ununiformity of the chemical activity and/or any lack of smoothness of the entire surface of the shiny side. The evenness of the freshly formed copper surface enhances the homogeneity and completeness of the thermal oxidation-resistant plated layer to be formed subsequently by thermal oxidation resistance treatment, rendering it possible to take the full advantage of the thermal oxidation-resistant treated layer. Thus a surface treatment technique of imparting a thermal oxidation resistance upon heating at 300° C. for 30 minutes to the shiny side of copper foil has now been successfully developed for the first time in the art.

7 Claims, No Drawings

COPPER FOIL FOR PRINTED CIRCUITS

INDUSTRIAL FIELD OF THE INVENTION

This invention relates to a copper foil for printed circuits and a process for producing the foil, and more specifically to a copper foil for printed circuits characterized in that the shiny side of the foil is formed with a copper plating layer or is etched before being treated for thermal oxidation resistance, so as to improve its thermal oxidation resistance (resistance to tarnishing with oxidation due to the heat history during the fabrication of printed circuit boards or the like), and a process for producing the foil.

BACKGROUND OF THE INVENTION

Copper foils and copper alloy foils (hereinafter collectively called "copper foils") are significantly contributing to the progress of the electric, electronic and related industries. Notably, they are indispensable for the fabrication of printed circuits. Copper foil for printed circuits generally is laminated and bonded to a base of thermoplastic resin board, film or the like at high temperature and high pressure, with or without the aid of an adhesive, printed with necessary circuit patterns to form objective circuits, and then is etched to remove unnecessary portions. Finally, desired elements are soldered in place, and in this way various printed circuit boards for electronic devices are fabricated. Qualitative requirements for the copper foil for printed circuit boards differ with the sides, namely, the surface of the side to be bonded to the resin base (matt side) and the surface of the opposite side not to be bonded to the base (shiny side).

Requirements for the matt side chiefly include:
(1) No possibility of oxidative tarnishing during storage;
(2) Adequate resistance to peeling from the base even after high-temperature heating, wet treatment, soldering, chemical treatment or the like; and
(3) Freedom from so-called lamination spots that can result from lamination to the base and etching.

Requirements for the shiny side include:
(1) Good appearance and no oxidative tarnishing during storage;
(2) Good solder wettability;
(3) No oxidative tarnishing upon high-temperature heating; and
(4) Good adhesion to resist.

As for the thermal oxidation resistance of the shiny side, the requirement has become more and more stringent in recent years. For one thing, copper foils have come to be exposed to higher temperatures than heretofore because of the advent of novel, highly heat-resistant resins as well as a new manufacturing method which is known as the "double-layer flexible base process". This method comprises directly applying a polyimide varnish to a copper foil, thereby forming a double-layer structure of polyimide and copper foil layers. With conventional lamination techniques too, there is a tendency toward the replacement of the usual nitrogen atmosphere by air to reduce the cost of laminating and curing processes that involve heat treatment. This is another factor demanding an improvement in the thermal oxidation resistance of the shiny side of copper foil. The shiny side to be printed with minute electric circuits ought to be protected against tarnishing or other deleterious effects of oxidation. To be more concrete, the shiny surface today is required to undergo no tarnishing on holding at 300° C. for 30 minutes.

For the surface treatment of the shiny side to meet all the foregoing requirements, a method combining zinc plating with chromate treatment has predominantly been used. However, the thermal oxidation resistance that the method imparts is limited, e.g., just enough for holding at 200° C. for about 30 minutes. The resistance increases in proportion to the amount of zinc plating used, but it is known to present problems of yellowing ("brassing") after bonding and of low printability due to decreased resistance to acid.

Another method reportedly under development replaces the zinc plating with zinc-nickel plating, zinc-cobalt plating or the like for the formation of a zinc alloy layer as a thermal oxidation-resistant treated layer, followed by chromate treatment. Even the proposed method is unable to make the shiny side resistant to thermal oxidation under the conditions of 300° C. and 30 minutes; it imparts a resistance to tarnishing for at most 30 minutes at 240° C. or 10 minutes at 270° C.

OBJECT OF THE INVENTION

The present invention has for its object the development of a technique for the surface treatment of the shiny side of a copper foil to impart thermal oxidation resistance under the conditions of 300° C. and 30 minutes so that the foil surface can be protected against yellowing as well as tarnishing with oxidation.

SUMMARY OF THE INVENTION

The present inventor has investigated on the possible causes of oxidative tarnishing and yellowing of the copper foil surface upon treatment for thermal oxidation resistance at 300° C. for 30 minutes. The investigations have led to the conclusion that those defects are attributable to the ununiformity of chemical activity and/or the lack of smoothness of the shiny side of the copper foil before being treated for thermal oxidation resistance. Copper foils are commonly made by electrodepositing copper on a smooth cathode drum surface and then peeling off the electrodeposit. Since the side of the deposit on the cathode serves as the shiny side of the resulting foil, it has been believed that the shiny side is adequately smooth. Moreover, because the treatment for thermal oxidation resistance is preceded by acid pickling and water washing, the uniformity of chemical activity throughout has been taken for granted. These fixed ideas have hampered casting light on the facts to the contrary. Actually, observation under a scanning electron microscope of the copper foil so obtained reveals that its shiny side has numerous minute pits scattered throughout. When the copper foil thus manufactured is coated at its shiny side with a thin layer of Zn plating (0.001–0.01 µm thick) and its distribution condition is examined with the use of EPMA (Electron Probe Micro Analyzer) line analysis, there is an evidence of substantial segregation, which means that the chemical activity is not even too. If the shiny side that lacks in smoothness and/or uniformity of chemical activity is directly treated for thermal oxidation resistance, the thermal oxidation-resistant plating layer so formed inherits the deficiencies of the shiny side as peeled from the cathode drum, failing to take the full advantage of the thermal oxidation resistance treatment. The present inventor has now found for certain that thin copper plating onto or etching of the shiny side of copper foil is effective in overcoming the lack of smoothness and/or the ununiformity of chemical activity of the shiny side.

On the basis of this discovery, the present invention provides:

(A) a highly thermal oxidation-resistant copper foil for printed circuits including a thermal oxidation-resistant treated layer formed on the shiny side of the foil and a Cr-base anticorrosive treated layer formed further thereon, characterized in that a copper plating layer is provided between the shiny side of the foil and the thermal oxidation-resistant treated layer, said copper plating layer being preferably composed of fresh copper layer with a thickness of 1 to 20 mg/dm$^2$ deposited over the entire surface, (B) a process for producing a copper foil for printed circuits which comprises treating the shiny side of the foil for thermal oxidation resistance and then subjecting it to a Cr-base anticorrosive treatment, characterized in that the shiny side of the copper foil is copper-plated before the thermal oxidation resistance treatment, (C) a highly thermal oxidation-resistant copper foil for printed circuits including a thermal oxidation-resistant treated layer formed on the shiny side of the foil and a Cr-base anticorrosive treated layer formed further thereon, characterized in that the shiny side of the foil is an etched surface, and (D) a process for producing a copper foil for printed circuits which comprises treating the shiny side-of the foil for thermal oxidation resistance and then subjecting it to a Cr-base anticorrosive treatment, characterized in that the shiny side of the copper foil is etched before the thermal oxidation resistance treatment, said etched surface preferably being formed using an aqueous solution of ammonium persulfate.

DESCRIPTION OF EMBODIMENTS OF THE INVENTION

Deposition of a thin copper plating over the shiny side of a copper foil produces a complete covering of fresh copper on that side. The evenness of the copper surface enhances the homogeneity and completeness of the thermal oxidation-resistant plating layer to be subsequently formed by thermal oxidation-resistance treatment and permits those merits to be fully taken advantage of. Etching of the shiny side purifies the surface by the melting of the copper foil itself, to say nothing of copper oxide, and makes the chemical activity uniform throughout the surface. This uniformity, in turn, ensures the homogeneity and completeness of the thermal oxidation-resistant plating layer to be formed by thermal oxidation resistance treatment, rendering it possible to make the most of those merits.

The copper foil to be used in the present invention may be either electrolytic or rolled copper foil. While the present invention itself is directed to the shiny side of the copper foil, the matt side of the foil is briefly described here for reference. Usually, the side of a copper foil to be bonded to a resin base, or the matt side, is matted by electrodeposition of copper knurls on a degreased copper foil surface for the purpose of increasing the peel strength of the foil after lamination. The electrodeposition of knurls is easily performed by forming so-called burnt electrodeposits. The matting is sometimes preceded or followed by ordinary copper plating or other pretreatment as pretreatment or finish treatment. Exemplary conditions for copper matting treatment are as follows:

| Copper matting treatment conditions | |
|---|---|
| Cu | 10–25 g/l |
| H$_2$SO$_4$ | 20–100 g/l |
| Temperature | 20–40° C. |
| D$_k$ | 30–70 A/dm$^2$ |
| Time | 1–5 second |

The matting desirably is followed by a treatment to form on the matted surface a metal layer or alloy layer of one or two or more metals selected from the group consisting of Cu, Cr, Ni, Fe, Co, and Zn. Combinations of Cu—Ni, Cu—Co, Cu—Ni—Co, and Cu—Zn may be cited as examples of alloy plating. (Refer to Patent Application Publication No. 9028/1981, Patent Application Public Disclosure Nos. 13971/1979, 292895/1990, and 292894/1990, and Patent Application Publication Nos. 35711/1976 and 6701/1979.) Such a treatment determines the ultimate properties of the copper foil and also provides a barrier for the foil.

In accordance with the present invention, the shiny side of a copper foil, pretreated by acid pickling, water washing and the like in the usual manner with or without concomitant treatment of the matt side, is either (A) copper-plated or (B) etched.

(A) In the case of copper plating, it is only necessary that fresh copper be deposited on the entire surface of the shiny side. There is no limitation, therefore, to the type of bath to be used. However, from the viewpoint of handling, an ordinary copper sulfate-sulfuric acid bath is the most convenient. The composition of the plating solution and the plating conditions are not exacting either. Desirable ranges for the plating solution composition are Cu$^{2+}$: 20–40 g/l and H$_2$SO$_4$: 50–100 g/l. With regard to the plating conditions, the higher the bath temperature the better, but a temperature in the range of 30°–60° C. gives satisfactory results. Proper current density cannot be unequivocally defined since it is dependent upon the quantity of electricity to be used. A generally effective range is 1–80 A/dm$^2$, preferably 20±5 A/dm$^1$. As for the plating time, a period of about 0.1–10 seconds is appropriate. The copper plating thus deposited improves the thermal oxidation resistance of the foil in proportion to the quantity of copper. However, excessive plating can deteriorate the mechanical properties of the copper foil itself or decelerate the treatment rate. A recommended range is 1–20 mg/dm$^2$.

The plated copper completely covers up the pits about 0.1–0.3 μm in size that originally scatter on the shiny side of the copper foil, forming a copper coat of fresh copper formed over the entire surface by plating. This has experimentally been confirmed by observation under a scanning electron microscope (SEM) with a magnification of 30,000.

(B) In the case of etching, the etching method need only produce a copper surface with a uniform chemical activity. The type of bath and the procedure of etching are not critical. Etching methods are roughly divided into two groups, dry (blast and ionizing radiation) and wet (chemical and electrochemical processes). Accuracy, economy, and other considerations make chemical etching the most expedient. While the type of etching bath is not specially restricted, an aqueous solution of ammonium persulfate well known as an etching solution for copper materials is a good choice. The amount of etching is dictated by the concentration of ammonium persulfate, bath temperature, time, agitating condition, and other factors. A desirable amount of etching is not specifically limited but, in terms of the theoretical mean thickness found from the amount of Cu in the etching bath, it ranges from 0.005 to 0.1 μm. If it is less than 0.005 μm, it does not impart complete uniformity of chemical activity. The larger the amount of etching the better the thermal oxidation resistance the foil acquires. An amount in excess of 0.1 μm is undesirable, however, because it can cause changes in the mechanical properties of the foil itself. More desirably, the amount of etching ranges between 0.01 and 0.05 μm. The ammonium persulfate concentration, bath temperature, time, and agitating conditions for that amount of etching cannot be unequivocally specified. Typically, the amount of etching is 0.03 μm under the following set of conditions:

ammonium persulfate concentration: 10 g/l, bath temperature: 25° C., linear velocity of both agitation: 1 m/sec; and etching time: 5 seconds. It has been confirmed by examination with EPMA line analysis that Zn segregation is absent upon that etching when the shiny side of a copper foil is coated with a thin-layer Zn plating (0.001–0.01 μm thick).

Following this, procedure the copper-plated or etched shiny side is treated for thermal oxidation resistance and then subjected to a Cr-base anticorrosive treatment in the usual manner.

The treatment for thermal oxidation resistance may be conducted in any known manner. For example, it may be carried out as a zinc alloy plating, such as with a Zn-Ni alloy or Zn-Co alloy. For the purposes of the invention, the "treatment as a thermal oxidation resistance" is defined as a treatment for preventing tarnishing as by oxidation under the conditions of 100° C. or above for 30 minutes, preferably 200° C. or above for 30 minutes, more preferably 240° C. or above for 30 minutes, in air. Practical examples include treatments with Zn or with an alloy of Zn and one or more metals chosen from among Ni, Co, V, W, Mo, Sn, Cr, etc.

Taking the treatment with a Zn—Ni alloy for example, it is performed, preferably using a Zn—Ni electroplating bath, to form a very thin Zn—Ni alloy layer desirably comprising 50–97% by weight of Zn and 3–50% by weight of Ni at a deposition rate of 100–500 μg/dm². If the Ni content is less than 3% by weight, there is no improvement in thermal oxidation resistance as desired. If the Ni content exceeds 50% by weight, the solder wettability and thermal oxidation resistance are reduced. If the deposition rate of the Zn—Ni alloy layer is below 100 μg/dm², no improvement in thermal oxidation resistance results- If it is above 500 μg/dm², diffusion of Zn, and of the alloying metal, deteriorates the electric conductivity. A proper Zn—Ni alloy layer enhances the thermal oxidation resistance of the shiny side of a copper foil while maintaining the solder wettability, resist adhesion, and other desirable properties of the foil unimpaired. The deposition rate is specified as above, for one thing, to form a layer thin enough to retain as much appearance of copper as possible.

A, a Zn—Co alloy treatment is similarly conducted, preferably using a Zn-Co electroplating bath, to form a very thin Zn—Co alloy layer desirably comprising 50–97% by weight of Zn and 3–50% by weight of Co at a deposition rate of 100–500 μg/dm². If the Co content is less than 3% by weight, there is no improvement in thermal oxidation resistance as desired. If the Co content is more than 50% by weight, the solder wettability and thermal oxidation resistance are reduced. If the deposition rate of the Zn—Co alloy layer is below 100 μg/dm², no improvement in thermal oxidation resistance results. If it is above 500 μg/dm², diffusion of Zn, and of the alloying metal, deteriorates the electric conductivity. It also can affect the solder wettability adversely in processes where flux is not employed. The deposition rate is specified as above, for one thing, to form a layer thin enough to retain as much appearance of copper as possible.

A typical composition of a Zn—Ni alloy or Zn—Co plating bath and typical plating conditions are as follows:

| | |
|---|---|
| Zn | 5–50 g/l |
| Ni (or Co) | 1–50 g/l |
| pH | 2.5–4 |
| Temperature | 30–60° C. |
| Current density | 0.5–5 A/dm² |
| Plating time | 0.1–10 seconds |

After water washing, the thermal oxidation-resistant treated layer is anticorrosively treated with a Cr-base compound. The term "Cr-base anticorrosive treated layer" as used herein means an anticorrosive layer consisting mainly of chromium oxide formed by (1) coating with chromium oxide alone, (2) mixed coating with chromium oxide and zinc and/or zinc oxide, or (3) both.

Coating with chromium oxide alone may be done by either dip chromate or electrolytic chromate treatment. Where weathering resistance is required, electrolytic chromate treatment is preferred. Whichever treatment is used, the conditions for the treatment conform to those conditions established in the art. Exemplary conditions for dip and electrolytic chromate treatments are given below,

| | |
|---|---|
| (A) Dip chromate treatment | |
| $K_2Cr_2O_7$ | 0.5–1.5 g/l |
| pH | 1.4–5.0 |
| Temperature | 20–60° C. |
| Time | 3–10 seconds |
| (B) Electrolytic chromate treatment | |
| $K_2Cr_2O_7$ ($Na_2Cr_2O_7$ or $CrO_3$) | 2–10 g/l |
| NaOH or KOH | 10–50 g/l |
| pH | 7–13 |
| Bath temperature | 20–80° C. |
| Current density | 0.05–5 A/dm² |
| Time | 5–30 seconds |
| Anode | Pt-Ti, stainless steel sheet, etc. |

The expression "mixed coating with chromium oxide and zinc/zinc oxide" as used herein means a treatment, known as electrolytic zinc-chromium treatment, whereby a surface is coated with an anticorrosive layer of zinc or a zinc-chromium-base mixture consisting of zinc oxide and chromium oxide by electric plating using a plating bath containing a zinc salt or zinc oxide and a chromic salt. As the plating bath, typically a mixed aqueous solution of at least one of bichromates, such as $K_2Cr_2O_7$ or $Na_2Cr_2O_7$, at least one of zinc compounds, such as ZnO or $ZnSO_4.7H_2O$, and an alkali hydroxide is used. A typical plating bath composition and electrolytic conditions are as follows.

| | |
|---|---|
| (C) Electrolytic zinc-chromium treatment | |
| $K_2Cr_2O_7$ ($Na_2Cr_2O_7$ or $CrO_3$) | 2–10 g/l |
| NaOH or KOH | 10–50 g/l |
| ZnO or $ZnSO_4.7H_2O$ | 0.05–10 g/l |
| pH | 7–13 |
| Bath temperature | 20–80° C. |
| Current density | 0.05–5 A/dm² |
| Time | 5–30 seconds |
| Anode | Pt-Ti, stainless steel sheet, etc. |

Coating amounts required of chromium oxide and zinc are at least 15 μg/dm² as chromium and at least 30 μg/dm², respectively. The thickness of coating may differ for the shiny and matt sides of the foil. Anticorrosive processes of this character are disclosed in prior publications including Patent Application Publication Nos. 7077/1983, 33908/1986, and 14040/1987. The combination of coating with chromium oxide alone and coating with a mixture of chromium oxide and zinc/zinc oxide is also effective.

The copper foil obtained after subsequent water washing and drying in conformity with the present invention is capable of withstanding thermally oxidizing conditions of 300° C. and 30 minutes. Moreover, it can retain its solder wettability, resist adhesion, and other properties unimpaired. In contrast to this, conventionally zinc-plated and chromate-treated copper foils are unable to resist less severely oxidizing environments of more than about 200° C. for 30 minutes. Even those foils directly treated for thermal oxidation resistance without prior copper plating cannot resist tarnishing under high temperature conditions of more than 240° C. for 30 minutes or 270° C. for 10 minutes.

Finally, if needed, a silane treatment is performed whereby the anticorrosive layer is coated, on at least the matt side, with a silane coupling agent primarily for the purpose of increasing the adhesion between the copper foil and the resin base. The coating may be done in whatever manner desirable, e.g., by spraying, application by means of a coater, immersion, or casting of a solution of a silane coupling agent. For instance, Patent Application Publication No. 15654/1985 teaches improving the adhesion between the copper foil and the resin base by treating the matt side of the foil first with chromate and then with a silane coupling agent. For more details, refer to the cited publication.

Additionally, when necessary, the copper foil may be annealed to enhance its ductility.

EXAMPLES

By way of illustration, examples of the present invention and comparative examples are given below. Copper foils obtained were tested for the amounts of surface deposits, baking resistance, and solder wettability on the shiny side. For the surface analysis, each test specimen was dipped in acid, with its matt side masked by pressing with a base material, such as FR-4, to dissolve Zn and Ni or Co from only the shiny side, and the surface was analyzed by atomic-absorption spectroscopy. For the baking test, a test piece of copper foil, 600 mm wide and 100 mm long, was placed into an oven under heating conditions of 300° C. and 30 minutes, taken out, and the shiny side was inspected for any tarnishing. As for the solder wettability, a copper foil pressed against a base was vertically dipped into a solder tank using a flux "JS64" made by San-ei Chemical Co. The angle of wetting with solder drawn up along the base surface was measured. The smaller the angle the better the solder wettability.

Example 1

The shiny side of a 35 μm-thick electrolytic copper foil was acid-pickled and washed with water. It was then copper-plated, itself serving as a cathode and using a copper sheet as an anode, with a bath composition containing 35 g/l of $Cu^{2+}$ and 100 g/l of $H_2SO_4$. The plating conditions were: bath temperature, 40° C.; cathode current density, 20 A/dm², and current supply time, 0.4 second. Copper was electrodeposited at the rate of about 2.6 mg/dm². The copper-plated shiny side, when observed under SEM, proved to have a smooth surface with a uniform layer of freshly electrodeposited copper.

Immediately following this, Zn—Ni alloy plating was carried out using the shiny side thus obtained as a cathode and a zinc sheet as an anode, with a Zn—Ni bath of a composition containing 20 g/l Zn and 5 g/l Ni, at a pH of 3.5, bath temperature of 40° C., and cathode current density of 2.0 A/dm² for a current supply time of 0.6 second. The plated surface was chromate-treated by a dip into a chromate treating solution of a bath composition containing 3.5 g/l of $CrO_3$, at a pH of 4.8 and a temperature of 50° C. The treatment was immediately followed by water rinsing and drying, and a thermal oxidation-resistant, anticorrosively treated shiny side surface was obtained. The shiny surface contained 200 μg/dm² of Zn, 25 μg/cm² of Ni, and 15 μg/dm² of Cr. Its angle of solder wetting was 42.7° and the wettability was as good as 100%.

The thermal oxidation-resistant copper foil so obtained showed no oxidative tarnishing or yellowing upon heating at 300° C. for 30 minutes in a baking test.

Comparative Example 1

An electrolytic copper foil was Zn—Ni alloy-plated and chromate-treated in the same manner as that in Example 1 excepting the prior copper plating, and a thermal oxidation-resistant, anticorrosively treated shiny side was obtained. The shiny side contained 200 μg/dm² of Zn, 25 μg/dm² of Ni, and 15 μg/dm² of Cr. The pits 0.1 to 0.3 μm in size that had originally scattered on the raw electrolytic copper foil remained almost unchanged. The resulting thermal oxidation-resistant copper foil showed oxidative tarnishing in the form of islets or speckles on heating at 300° C. for 30 minutes.

Example 2

The shiny side of a 35 μm-thick electrolytic copper foil was copper-plated in the manner described in Example 1. Next, Zn—Co alloy plating was carried out using the shiny side thus obtained as a cathode and a zinc sheet as an anode, with a Zn—Co bath of a composition containing 20 g/l Zn and 10 g/l Co, at a pH of 3, bath temperature of 40° C., and cathode current density of 2.0 A/dm² for a current supply time of 0.7 second. The plated surface was chromate-treated by a dip into the chromate treating solution of Example 1. The treatment was immediately followed by water rinsing and drying, and a thermal oxidation-resistant, anticorrosively treated shiny side surface was obtained. The shiny surface contained 230 μg/dm² of Zn, 23 μg/dm² of Co, and 30 μg/dm² of Cr. The thermal oxidation-resistant copper foil so obtained showed no oxidative tarnishing or yellowing upon heating at 300° C. for 30 minutes. Its angle of solder wetting was 42.7° and the wettability was as good as 100%.

Comparative Example 2

An electrolytic copper foil was treated in the manner described in Example 2 except that it was not copper-plated. The resulting thermal oxidation-resistant copper foil showed oxidative tarnishing in the form of islets or speckles on heating at 300° C. for 30 minutes.

Example 3

The shiny side of a 35 μm-thick electrolytic copper foil was acid-pickled and water-washed and then etched by a dip in an aqueous ammonium persulfate solution at a concentration of 10 g/l, at a bath temperature of 30° C. and an agitation linear velocity of 1 m/sec, for 5 seconds. The etching amount was 0.03 μm. This treated surface exhibited uniformity of deposition when subjected to line analysis of Zn on the plated surface after thin-layer Zn plating as stated above.

Next, Zn—Ni alloy plating was carried out using the shiny side thus obtained as a cathode and a zinc sheet as an anode, with a Zn—Ni bath of a composition containing 20 g/l Zn and 5 g/l Ni, at a pH of 3.5, bath temperature of 40° C., and cathode current density of 2.0 A/dm² for a current supply time of 0.6 second. The plate surface was chromate-treated by a dip into a chromate treating solution of a bath composition containing 3.5 g/l of $CrO_3$, at a pH of 4.8 and bath temperature of 50° C. The treatment was immediately followed by water rinsing and drying, and a thermal oxidation-resistant, anticorrosively treated shiny side surface was obtained. The shiny surface contained 200 μg/dm² of Zn, 25 μg/dm² of Ni, and 15 μg/dm² of Cr. Its angle of solder wetting was 42.7° and the wettability was as good as 100%.

The thermal oxidation-resistant copper foil so obtained showed no oxidative tarnishing or yellowing upon heating at 300° C. for 30 minutes in a baking test.

Comparative Example 3

An electrolytic copper foil was Zn—Ni alloy-plated and chromate-treated in the same manner as according to Example 3 but without etching, and a thermal oxidation-resistant, anticorrosively treated shiny side was obtained. The shiny side contained 200 μg/dm² of Zn, 25 μg/dm² of Ni, and 15 μg/dm² of Cr. The resulting thermal oxidation-resistant copper foil showed oxidative tarnishing in the form of islets or speckles on heating at 300° C. for 30 minutes.

Example 4

The shiny side of a 35 μm-thick electrolytic copper foil was etched in the manner described in Example 3. Next, Zn—Co alloy plating was carried out using the shiny side thus obtained as a cathode and a zinc sheet as an anode, with a Zn—Co bath of a composition containing 20 g/l Zn and 10 Co, at a pH of 3, bath temperature of 40° C., and cathode current density of 2.0 A/dm² for a current supply time of 0.7 second. The plated surface was chromate-treated by a dip into the same chromate treating solution as used in Example 3. The treatment was immediately followed by water rinsing and drying, and a thermal oxidation-resistant, anticorrosively treated shiny side surface was obtained. The shiny surface contained 230 μg/dm² of Zn, 23 μg/dm² of Co, and 30 μg/dm² of Cr. The thermal oxidation-resistant copper foil so obtained showed no oxidative tarnishing or yellowing upon heating at 300° C. for 30 minutes. Its angle of solder wetting was 41.6° and the wettability was as good as 100%.

Comparative Example 4

An electrolytic copper foil was treated in the manner described in Example 4 except that it was not etched. The resulting thermal oxidation-resistant copper foil showed oxidative tarnishing in the form of islets or speckles on heating at 300° C. for 30 minutes.

Advantages of the invention

The present invention provides a copper foil having a highly thermal oxidation-resistant shiny side which undergoes no such oxidative tarnishing or yellowing upon heating at 300° C. for 30 minutes that conventional products do. The shiny side is protected against tarnishing with the heat history during the fabrication of printed circuit boards, without concomitant impairment of its solder wettability, resist adhesion, and other desirable properties. Thus the product of the invention is capable of meeting future requirements for the copper foil for printed circuit boards.

What I claim:

1. A highly thermal oxidation-resistant copper foil for printed circuits comprising:

a copper foil having a shiny side;

a thermal oxidation-resistant layer comprising a Zn—Ni or Zn—Co alloy formed on the copper foil shiny side, a Cr-base anticorrosive layer formed on the thermal oxidation-resistant layer, and a copper plating layer between the foil shiny side and the thermal oxidation-resistant layer, said copper foil resisting thermal oxidation of its shiny side at 300° C. for 30 minutes.

2. A copper foil according to claim 1 wherein the copper plating layer comprises a fresh copper layer having a thickness of 1 to 20 mg/dm² deposited over the entire surface of the foil shiny side.

3. A copper foil according to claim 1 or 2 wherein the Cr-base anticorrosive layer is selected from the group consisting of:

(a) a coating of chromium oxide;

(b) a mixed coating of chromium oxide and zinc;

(c) a mixed coating of chromium oxide and zinc oxide; and (d) a mixed coating of chromium oxide and zinc and zinc oxide.

4. A highly thermal oxidation-resistant copper foil for printed circuits comprising:

a copper foil having an etched shiny side, a thermal oxidation-resistant layer comprising a Zn—Ni or Zn—Co alloy formed on the copper foil etched shiny side, and a Cr-base anticorrosive layer formed on the thermal oxidation-resistant layer, said copper foil resisting thermal oxidation of its shiny side at 300° C. for 30 minutes.

5. A copper foil according to claim 4 wherein the shiny side is etched from 0.005 to 0.1 μm.

6. A copper foil according to claim 4 wherein the shiny side is etched from 0.01 to 0.05 μm.

7. A copper foil according to claim 4 wherein the Cr-base anticorrosive layer is selected from the group consisting of:

(a) a coating of chromium oxide;

(b) a mixed coating of chromium oxide and zinc;

(c) a mixed coating of chromium oxide and zinc oxide; and (d) a mixed coating of chromium oxide, zinc and zinc oxide.

* * * * *